(12) United States Patent
Moncavage (10) Patent No.: US 8,689,686 B2
(45) Date of Patent: Apr. 8, 2014

(54) SCREEN PRINTING DEVICE WITH INFINITE LOOP STENCIL

(76) Inventor: Charles Moncavage, Nazareth, PA (US)

( * ) Notice: Subject to any disclaimer, the term of this patent is extended or adjusted under 35 U.S.C. 154(b) by 304 days.

(21) Appl. No.: 13/194,962

(22) Filed: Jul. 31, 2011

(65) Prior Publication Data

US 2013/0025481 A1 Jan. 31, 2013

(51) Int. Cl.
*B05C 17/04* (2006.01)
*B41L 13/00* (2006.01)
*B41F 35/00* (2006.01)

(52) U.S. Cl.
USPC ............ 101/123; 101/118; 101/119; 101/425

(58) Field of Classification Search
USPC ........... 101/116, 119, 120, 123, 124, 129, 35, 101/425, 118, 127
See application file for complete search history.

(56) References Cited

U.S. PATENT DOCUMENTS

| | | | | |
|---|---|---|---|---|
| 2,019,375 A | * | 10/1935 | Wheelwright | 101/115 |
| 3,366,503 A | * | 1/1968 | Dillhoefer et al. | 427/462 |
| 5,395,643 A | * | 3/1995 | Brown et al. | 427/98.4 |
| 5,553,536 A | * | 9/1996 | Van Os | 101/44 |
| 5,768,996 A | * | 6/1998 | Ackley | 101/483 |
| 5,976,269 A | * | 11/1999 | Hamasaki et al. | 134/21 |
| 6,431,064 B1 | * | 8/2002 | Claassen | 101/114 |
| 6,572,702 B1 | | 6/2003 | Freeman et al. | |
| 7,013,802 B2 | * | 3/2006 | Marszalkowski, Jr. | 101/129 |
| 7,178,459 B2 | * | 2/2007 | Stefani | 101/120 |
| 7,635,497 B2 | | 12/2009 | Bock | |
| 7,668,487 B2 | | 2/2010 | Sharma et al. | |
| 2006/0079358 A1 | | 4/2006 | Igarashi | |
| 2008/0084467 A1 | | 4/2008 | Satou et al. | |
| 2008/0118681 A1 | | 5/2008 | Ueno | |
| 2009/0205204 A1 | | 8/2009 | Ahnert et al. | |

\* cited by examiner

*Primary Examiner* — Ren Yan
(74) *Attorney, Agent, or Firm* — Joseph E. Maenner; Maenner & Associates, LLC (57) ABSTRACT

A screen printing device is disclosed. The screen printing device includes a screen printer workstation having a work path. The work path has an input end, an output end, and a conveyor for transporting a workpiece between the input end and the output end. A stencil assembly is adapted to engage the workpiece as the workpiece is transported between the input end and the output end. The stencil assembly includes a stencil having an endless loop. A method of applying a substance to a workpiece using an endless loop stencil is also disclosed.

16 Claims, 8 Drawing Sheets

SCREEN PRINTING DEVICE WITH INFINITE LOOP STENCIL

FIELD OF THE INVENTION

The present invention relates to a screen printing device for manufacturing electronic printed circuit boards that uses an infinite loop stencil to apply solder paste to a substrate.

BACKGROUND OF THE INVENTION

Screen printing machines are used during the fabrication of printed circuit boards. Planar substrates are advanced from a conveyor through the machine sequentially in a start-stop sequence during which, when the substrate stopped at a print location, a stencil is laid over the substrate and solder paste is spread over the stencil, with the solder paste being forced through openings in the stencil and onto the substrate. This can be a time intensive process with the constant starting and stopping of the conveyor.

Additionally, solder paste tends to build up in the stencil openings, which requires the fabrication process to be frequently stopped in order to clean the stencil. An additional problem with the current process is that, after the solder paste is applied, as the stencil is being lifted from the substrate, solder paste may also be lifted from the substrate, resulting in a less than desired application of the solder paste on the substrate.

It would be beneficial to provide a device that greatly reduces or eliminates the aforementioned deficiencies.

BRIEF SUMMARY OF THE INVENTION

Briefly, the present invention provides a screen printing device comprising a screen printer workstation having a work path. The work path has an input end, an output end, and a conveyor for transporting a workpiece between the input end and the output end. A stencil assembly is adapted to engage the workpiece as the workpiece is transported between the input end and the output end, wherein the stencil assembly comprises a stencil having an endless loop.

Further, the present invention also provides a screen printing stencil assembly comprising an endless loop stencil having a stencil design formed therein The endless loop stencil is wrapped around a plurality of rollers. The rollers are arranged such that the stencil is adapted to engage a workpiece in a plurality of discrete locations. A stencil cleaning station is operatively located along the endless loop stencil between each of the discrete locations.

Also, the present invention provides a screen printing stencil assembly comprising an endless loop stencil having a stencil design formed therein and a plurality of rollers around which the endless loop stencil is wrapped. The assembly further includes a solder paste applying station located between two of the plurality of rollers and a stencil cleaning station operatively located along the endless loop stencil.

Additionally, the present invention provides a method of printing a solder paste pattern on a substrate, comprising the steps of translating a substrate along a first direction; rolling an endless loop stencil along a plurality of rollers; engaging the endless loop stencil with the substrate between a first and second of the plurality of rollers as the endless loop stencil translates along the first direction; dispensing a first solder paste through the endless loop stencil and onto the substrate between the first and second of the plurality of rollers; and disengaging the endless loop stencil from the substrate. Additionally, the step of translating the substrate along the first direction may be performed while the other steps are also being performed.

The method further comprises the steps of re-engaging the endless loop stencil onto the substrate between a third and fourth of the plurality of rollers as the endless loop stencil translates along the first direction; and dispensing a second solder paste through the endless loop stencil and onto the substrate between the third and fourth of the plurality of rollers. The step of translating the substrate along the first direction may be performed while these two steps are being performed. Additionally, after re-engaging the endless loop stencil onto the substrate between the third and fourth of the plurality of rollers and before dispensing the second solder paste through the endless loop stencil, excess solder paste is cleaned from the endless loop stencil.

Further, the step of translating the substrate along the first direction comprises translating the substrate at first linear speed and the step of rolling the endless loop stencil along the plurality of rollers comprises rolling the endless loop stencil at a second linear speed, with the first linear speed and the second linear speed being equal.

Additionally, the step of rolling the endless loop stencil along the plurality of rollers comprises rolling the endless loop stencil along a second direction, generally orthogonal to the first direction.

BRIEF DESCRIPTION OF THE DRAWINGS

The accompanying drawings, which are incorporated herein and constitute part of this specification, illustrate the presently preferred embodiments of the invention, and, together with the general description given above and the detailed description given below, serve to explain features of the invention. In the drawings.

DETAILED DESCRIPTION OF THE INVENTION

Certain terminology is used in the following description for convenience only and is not limiting. The terminology includes the words above specifically mentioned, derivatives thereof and words of similar import. As used herein, the terms "upstream" and "downstream" are used to identify relative locations and directions of elements used in the present invention. A first device is upstream of a second device when the direction of movement results in the first device being encountered before the second device. Similarly, a first device is downstream of a second device when the direction of movement results in the first device being encountered after the second device. Further, as used herein, the term "roller" can mean a cylindrical device, a tubular device, a wheel, or any other rotatable device having a generally circular or curved outer perimeter around which an endless loop stencil may be rolled.

The embodiments described and illustrated below are not intended to be exhaustive or to limit the invention to the precise form disclosed. These embodiments are chosen and described to best explain the principle of the invention and its application and practical use and to enable others skilled in the art to best utilize the invention.

Referring in general to the Figures, an exemplary aspect of the present invention provides a screen printing stencil in endless loop configuration that is rotated around a series of rollers. When the stencil pattern on the stencil engages a workpiece, solder paste is applied through openings in the stencil pattern and onto the workpiece. After solder paste is applied through the stencil pattern, the stencil passes through a stencil cleaning station, which removes excess solder paste from the stencil pattern so that, when the stencil pattern encounters the next workpiece, the stencil pattern is clean and free from excess solder paste. The rotation of the stencil around the rollers allow for continuous movement of the workpiece and stencil, which significantly increases the throughput of workpieces because the screen printer machine on which the workpiece is being worked does not have to stop during operation for workpiece alignment (i.e. vision checks), printing, and stencil cleaning and drying.

Figure 1:
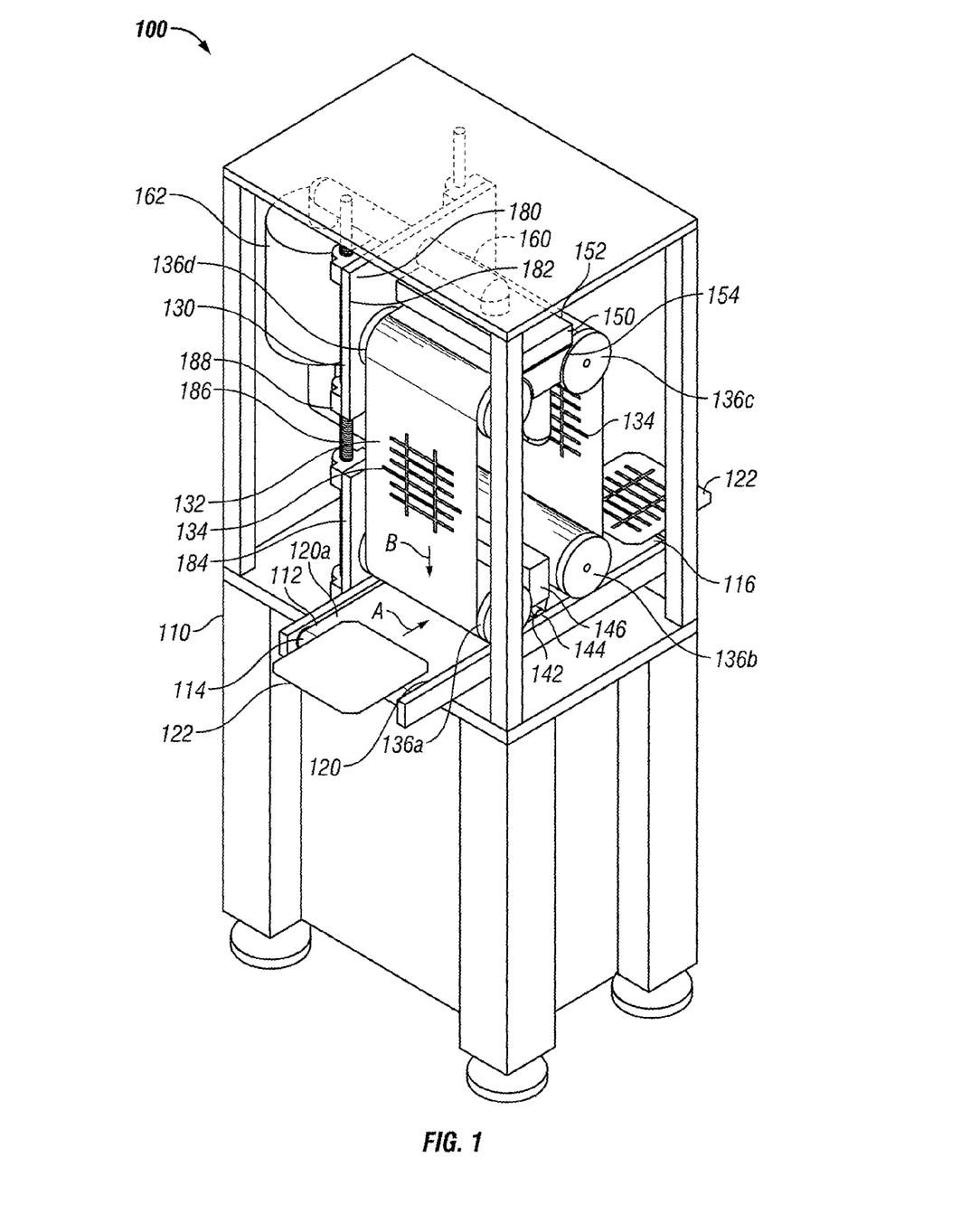
FIG. 1 is a perspective view of a screen printing device according to a first exemplary embodiment of the present invention.
Figure 1A:
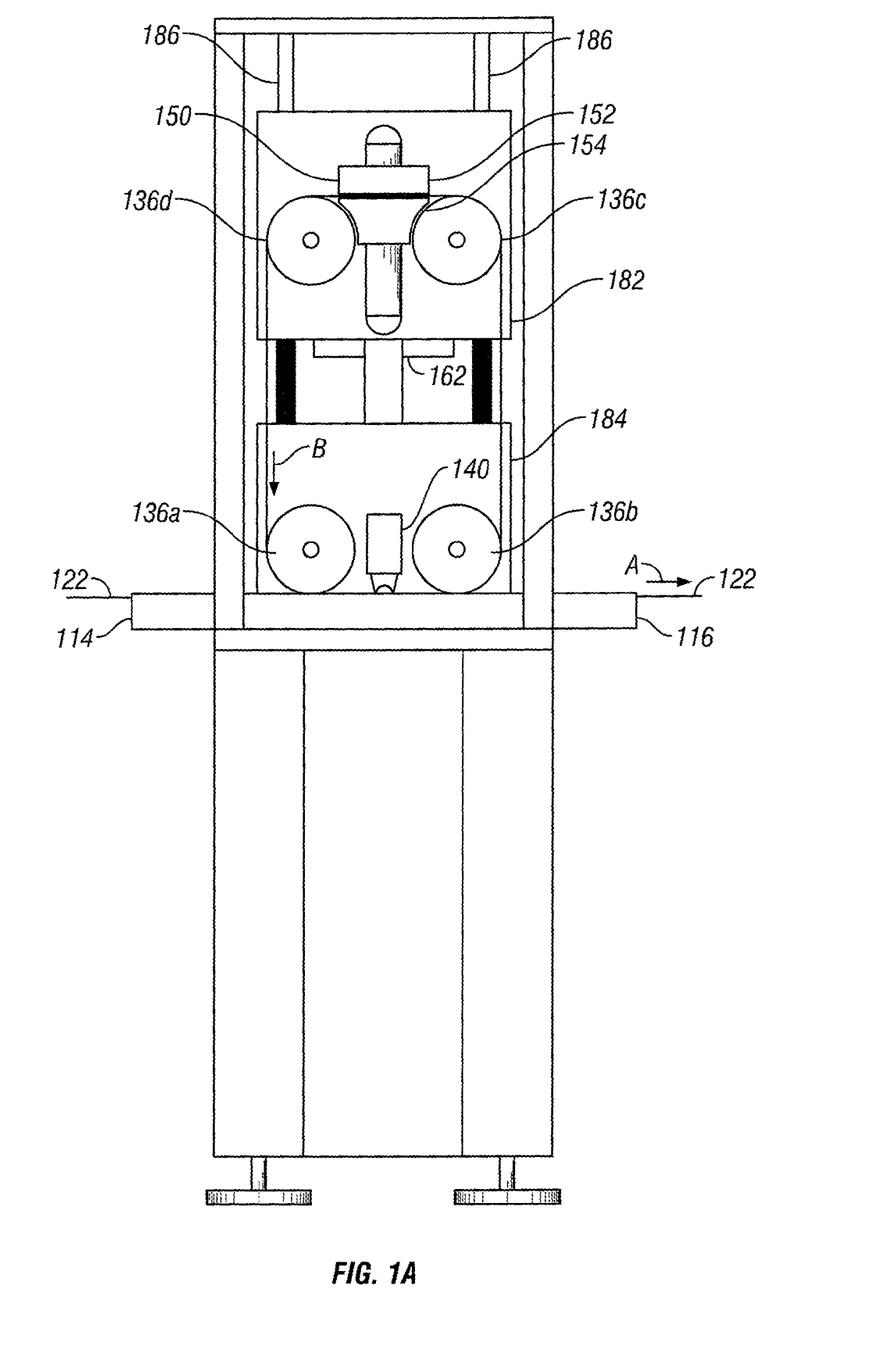
FIG. 1A is a front elevational view of the screen printing device shown in FIG. 1.

As shown in FIGS. 1 and 1A, a screen printing device 100 according to a first exemplary embodiment of the present invention includes a workstation 110 having an elongated work path 112. The work path has an input end 114, an output end 116, and a conveyor for transporting a workpiece between input end 114 and output end 116. In an exemplary embodiment, the conveyor is an endless belt conveyor 120 that may be driven by a motor (not shown). Conveyor 120 includes a top surface 120a on which a workpiece is transported and a bottom surface (not shown) that returns underneath top surface 120a from output end 116 to input end 114. The motor drives top surface 120a of conveyor 120 in a first linear direction from input end 114 toward output end 116, as shown by arrow A in FIG. 1, at a first linear velocity.

A stencil assembly 130 is adapted to engage workpiece 122 as workpiece 122 is transported along top surface 120a of conveyor 120 between input end 114 and output end 116. In exemplary embodiment, workpiece 122 is a substrate that is used to manufacture printed circuit boards. Workpiece 122, however, can be any generally flat, planar substrate. Screen printing device 100 is used to apply a solder paste to workpiece 122 in specific locations, which are defined by the pattern provided by stencil assembly 130.

Figure 2:
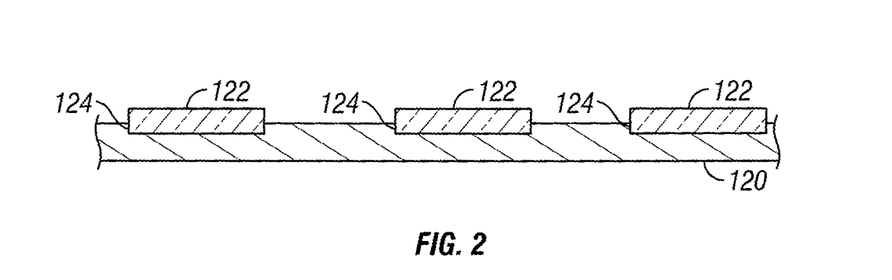
FIG. 2 is a front elevational view, in section, of a first exemplary embodiment of a conveyor used with the screen printing device shown in FIG. 1.

As shown in FIG. 2, conveyor 120 may include a plurality of recessed cavities 124. Each recessed cavity 124 is sized to snugly receive a workpiece 122. In an exemplary embodiment, the length and width of each recessed cavity 124 may be on the order of microns larger than the length and width of workpiece 122 in order to maintain workpiece 122 in a precise desired location on conveyor 120. Recessed cavities 124 are spaced from each other such that each time a workpiece 122 located in a recessed cavity 124 is in a location to receive solder paste, stencil assembly 130 is aligned with workpiece 122 such that solder paste can be properly applied through stencil assembly 130 onto workpiece 122. Recessed cavities 124 eliminate the time-consuming requirement of having to stop conveyor 120 in order to align and perform a visual inspection on each individual workpiece 122 with respect to its location relative to stencil assembly 130 prior to the application of solder paste to workpiece 122. The elimination of alignment/inspection downtime due to the present invention makes the solder paste application process quicker and more efficient than previous methods.

Optionally, with the recessed cavities 124, a workpiece 122 can be soldered, cured, and reinserted into a recessed cavity 124 at input and 114 and printed on top of the previous print. Such printing may be desired in solar applications where it is desirable to print taller deposits without infringing on the substrate surface area.

Figure 2A:
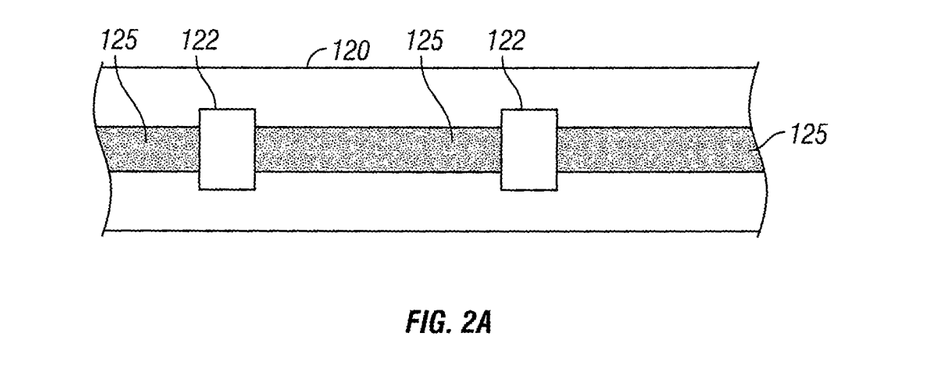
FIG. 2A is a top plan view of a second exemplary embodiment of a conveyor used with screen printing device shown in FIG. 1.

Alternatively, is as shown FIG. 2A, conveyor 120 may include a plurality of perforations 125 formed therein. A vacuum may be drawn from underneath conveyor 120 and through perforations 125 such that workpiece 122 is sucked onto conveyor 120 by the vacuum. Workpieces 122 may be sequentially placed onto conveyor 120 by a pick-and-place machine (not shown) that is timed to place each workpiece 122 onto conveyor 120 such that workpiece 122 is in proper position on conveyor 120 when it is desired to apply solder paste to workpiece 122.

Stencil assembly 130 comprises a stencil 132 having an endless loop. A stencil design 134 with a plurality of through openings is formed in stencil 132, which corresponds to the desired solder paste locations on workpiece 122. A plurality of stencil designs 134 may be formed in stencil 132. In an exemplary embodiment, the stencil designs 134 are all identical to each other. In an alternative exemplary embodiment, a plurality of different stencil designs may be formed in stencil 132.

A plurality of rollers 136a-136d is used to roll stencil 132 and to change the direction of stencil 132 as stencil 132 rolls. In an exemplary embodiment, rollers 136a-136d have a diameter of approximately 3-4 inches (7.62-10.16 cm). Those skilled in the art, however, will recognize that other diameter rollers may be used. It is desired that diameter of each roller 136a-136b and the linear velocity of stencil 132 are combined so that stencil 132 peels away from workpiece 122 after solder paste is applied to workpiece 122 such that the solder paste does not peel off from workpiece 122 with stencil 132. For example, a smaller diameter roller may require a lower linear velocity of stencil 132.

Stencil 132 is maintained in tension between roller 136a and roller 136d in between roller 136b and roller 136c by a tensioning mechanism 180, which includes an upper portion 182 that vertically moves rollers 136c and 136d and a lower portion 184 that maintains rollers 136a and 136b in a lowered position. A pair of threaded rods 186 (only one threaded rod 186 is shown in FIG. 1) operatively couple upper portion 182 and lower portion 184 together such that, when threaded rods 186 are rotated in a first direction by a motor 188, which is mounted to upper portion 182, upper portion 182 moves upward, away from lower portion 184, tightening the tension on stencil 132. When motor 188 rotates threaded rods 186 in a second direction, opposite from the first direction, upper portion 182 moves downward, toward lower portion 184, which releases the tension on stencil 132, allowing stencil 132 to be removed from stencil assembly 130.

Stencil 132 is rotated in a second linear direction, as shown by arrow B in FIG. 1, such that, when stencil 130 engages workpiece 122, stencil 132 is moving in the same direction as the first linear direction in which conveyor 120 moves workpiece 122. Additionally, as stencil 132 moves between rollers 136a and 136b, stencil 132 is moving at the same linear velocity as top surface 120a of conveyor 120.

A solder paste applying station 140 applies solder paste to workpiece 122 through the openings in stencil design 134. As shown in FIG. 1, solder paste applying station 140 is located between rollers 136a and 136b. Solder paste applying station 140 includes a solder paste dispenser 142 and a blade 144 located downstream from dispenser 142 to clean excess solder paste from stencil 132 and to force solder paste into the openings in stencil design 134. Solder paste applying station 140 is fixed between rollers 136a and 136b. The movement of stencil 132 between rollers 136a and 136b provides relative movement between stencil design 134 and blade 144 so that solder paste is impressed through the openings in stencil design 134 and onto workpiece 122. A solder paste reservoir 146 gravity feeds and/or pumps the solder paste to solder paste dispenser 142.

Stencil 132 is aligned with conveyor 120 such that when workpiece 122 is underneath stencil 132 between rollers 136a and 136b, stencil 132 engages workpiece 122 such that stencil design 134 is over workpiece 122 so that solder paste being applied by solder paste applying station 140 flows through the openings in stencil design 134 and on to workpiece 122.

Figure 3:
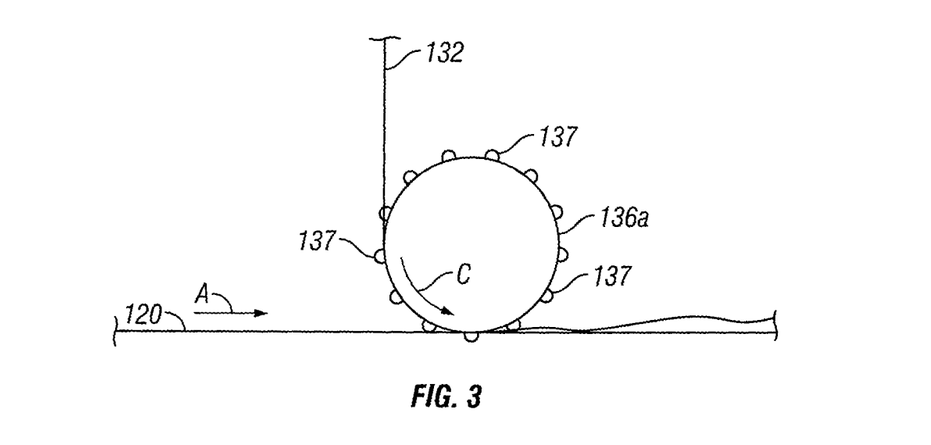
FIG. 3 is a front elevational view of a drive mechanism for driving a stencil concurrently with a conveyor in the screen printing device shown in FIG. 1.
Figure 3A:
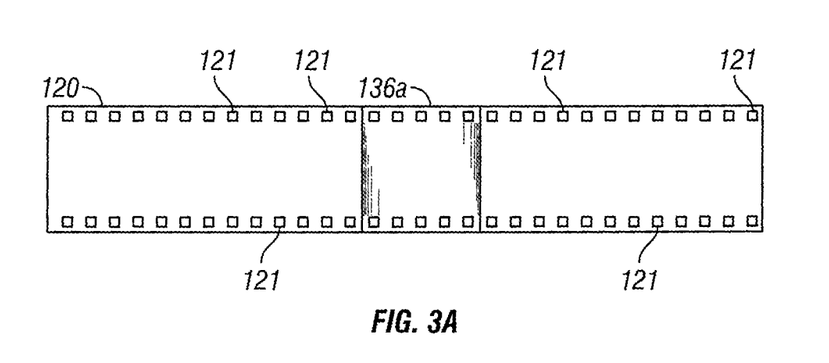
FIG. 3A is a top plan view of the drive mechanism shown in FIG. 3.
Figure 3B:
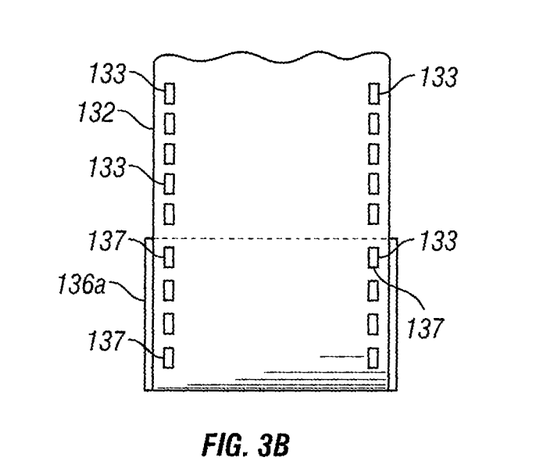
FIG. 3B is a side elevational view of the drive mechanism shown in FIG. 3.

In an exemplary embodiment, roller 136a and/or roller 136b can be mechanically coupled to conveyor 120. For example, as shown in FIGS. 3-3B, roller 136a can include a plurality of sprockets 137 extending around an outer perimeter thereof and conveyor 120 can include a plurality of sprocket openings 121 that are sized to engage sprockets 137 and to rotate roller 136a in a counterclockwise direction as shown by arrow C as conveyor 120 moves the linear direction as shown by arrow A in FIG. 3. Additionally, stencil 132 can include a plurality of sprocket openings 133 that are also sized to engage sprockets 137 such that stencil 132 rolls around rollers 136a-136d as conveyor 120 rotates roller 136a.

Alternatively, instead of sprockets, those skilled in the art will recognize that other types of alignment/movement mechanisms can be used to ensure that stencil 132 is rolling at the same linear speed as conveyor 120. For example, a roller, such as roller 136a, may be connected to the output of the conveyor motor via a belt or chain drive. Still alternatively, friction between conveyor 120 and rollers 136a and 136b may be sufficiently high so that the movement of conveyor 120 results in the rolling of rollers 136a and 136b, which in turn rotates stencil 132.

A stencil cleaning station 150 cleans excess solder paste from stencil 132, particularly from the openings in stencil design 134, after stencil design 134 is used to apply solder paste to a workpiece 122. In an exemplary embodiment, as shown in FIG. 1, stencil cleaning station 150 is generally located between rollers 136c and 136d. Those skilled in the art, however, will recognize that stencil cleaning station 150 can be located anywhere along the path of stencil 132.

Figure 4:
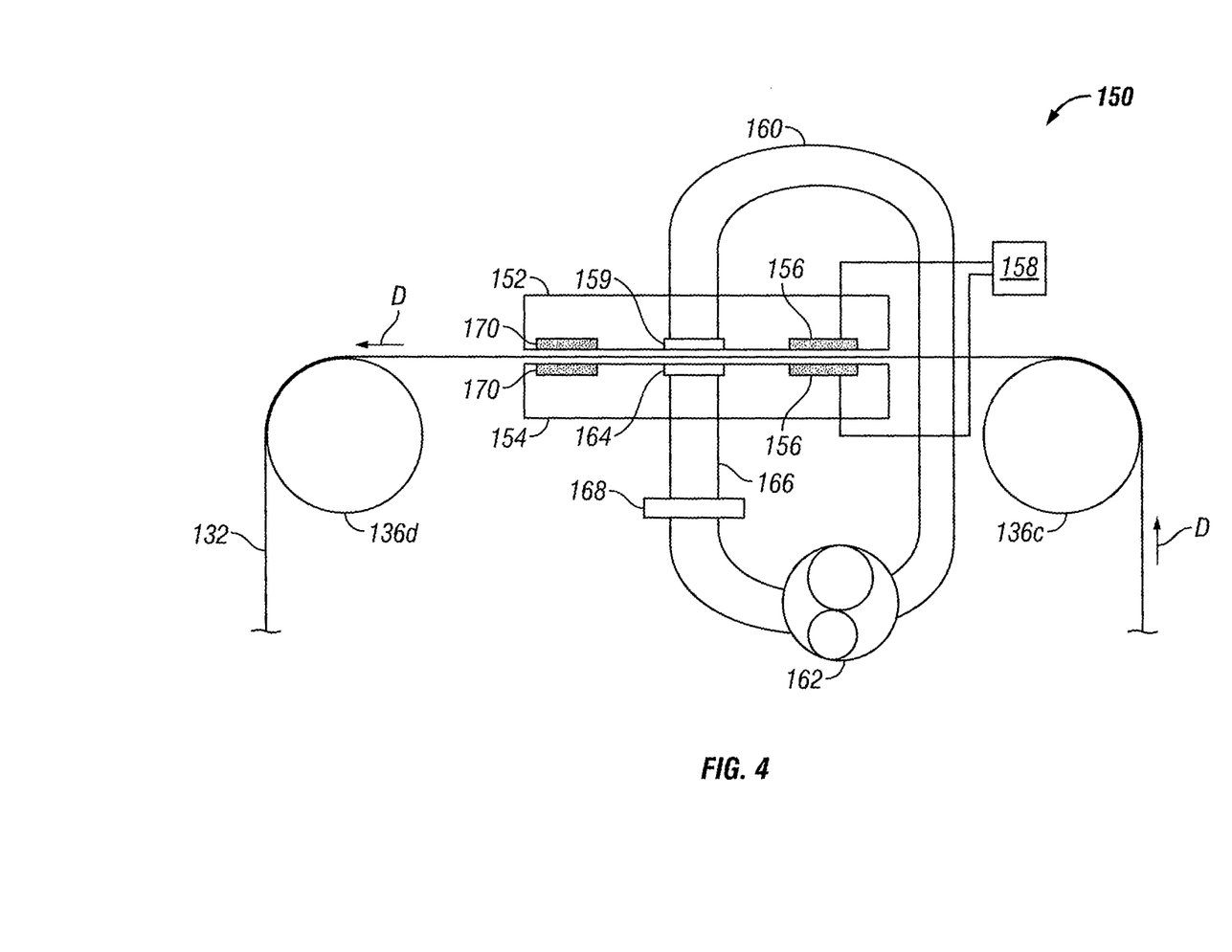
FIG. 4 is a schematic drawing of a stencil cleaning device use with the screen printing device shown in FIG. 1.

Referring to FIG. 4, cleaning station 150 includes a first cleaning head 152 located on a first side of stencil 132 and a second cleaning head 154 located on opposing side of stencil 132. First cleaning head 152 and second cleaning head 154 each engage a side of stencil 132 although, for illustrative purposes, FIG. 4 shows a space between first cleaning head 152 and stencil 132 and a space between second cleaning head 154 and stencil 132.

As shown in FIG. 4, stencil 132 moves in the direction of arrows D, in a generally right-to-left direction between roller 136c and roller 136d, with cleaning station 150 located between roller 136c and roller 136d such that cleaning station 150 is located downstream of roller 136c and roller 136d is located downstream of cleaning station 150. Cleaning station 150 uses a combination of scrubbing pad, pressurized air/vacuum, and drying pad to clean excess solder paste from stencil 132.

Each cleaning head 152, 154 includes a stencil scrubber, or scrub pad 156, that is used to loosen solder paste from stencil 132. Scrub pad 156 may be a lint free fabric, a plurality of bristles or brushes, a foam material, a combination thereof, or any other suitable material to engage stencil 132 and remove solder paste without damaging stencil 132. Optionally, scrub pad 156 may be wetted with the solvent, such as, for example, isopropyl alcohol. Such solvent may be continuously applied to each scrub pad 156 or, alternatively, the solvent may be applied periodically. Solvent may be applied to both cleaning heads 152, 154 via a common solvent supply 158.

First cleaning head 152 includes a gas discharge opening 159 located downstream of scrub pad 156. Gas discharge opening 159 is in fluid communication with a gas discharge supply 160, which provides a flow of air generated by an air compressor 162. Gas discharge opening 159 blows air across stencil 132.

Second cleaning head 154 includes a vacuum opening 164 that is downstream of scrub pad 156. Vacuum opening 164 is in fluid communication with a vacuum line 166. Vacuum line 166 is in fluid communication with a suction side of air compressor 162 such that air that is discharged by air compressor 162 and out of gas discharge opening 159 is drawn into vacuum opening 164 and through vacuum line 166 by air compressor 162, which makes air compressor 162 also act as a vacuum system. Optionally, a filter 168 may be located between vacuum opening 164 and air compressor 162 to capture solid particles that are blown from stencil 132 by air that is blown out of gas discharge opening 159.

Gas discharge opening 159 and vacuum opening 164 are aligned with each other such that, as stencil design 134 passes gas discharge opening 159 and vacuum opening 164, are being discharged through gas discharge opening 159 passes straight through stencil design 134 and into vacuum opening 164. It may be desired to have gas discharge opening 159 located vertically above vacuum opening 164 so that solder paste particles that are removed from stencil 132 fall away from stencil 132 as a result of gravity, in addition to the vacuum generated through vacuum opening 164.

Each cleaning head 152, 154 includes a stencil dryer 170 that is located downstream of gas discharge opening 159 and vacuum opening 164. Stencil dryer 170 may be a cloth or otherwise absorbent pad that absorbs any liquid residue, such as solvent that has not been blown from stencil 132.

Optionally, the operation of cleaning station 150 can be timed such that gas discharge opening 159 only blows air over stencil 132 when stencil design 134 is at gas discharge opening 159. System 100 may be used in a continuous mode in which conveyor 120 and stencil 132 both operate without stopping. In the continuous mode, conveyor 120 and stencil 132 both move with the same linear velocity where solder paste applying station 140 apply solder paste through stencil 132 to workpiece 122.

To operate screen printing device 100, a desired stencil 132, which matches the pattern desire to be applied to workpieces 122 is inserted onto stencil assembly 130 by lowering upper portion 182 of tensioning mechanism 180, resulting in rollers 136c and 136d being lowered toward rollers 136a and 136*b*. Stencil 132 is then slid over rollers 136*a*-136*d*. Upper portion 182 of tensioning mechanism 180 is then raised, tightening stencil 132 around rollers 136*a*-136*d*.

A plurality of workpieces 122 are loaded onto conveyor 120, which is operated at a predetermined speed so that workpieces 122 move from input end 114 to output end 116 along elongated work path 112. Operation of conveyor 120 is continuous, which eliminates the downtime of having to start and stop the conveyor in order to apply solder paste to each individual workpiece 122, as is done in prior methods.

Workpieces 122 are spaced apart from each other on conveyor 120 such that, as stencil 132 rolls along rollers 136*a*-136*d*, stencil design 134 is aligned with one of the plurality of workpieces 122 at solder paste dispensing station 140, where solder is applied through the openings in stencil design 134 and onto workpiece 122. After stencil design 134 is used to apply solder paste, stencil design 134 is rolled away from conveyor 120 and toward stencil cleaning station 150, where scrub pads 156 on first and second cleaning heads 152, 154 scrub stencil design 134, loosening excess solder paste that may be on stencil design 134.

Gas discharge opening 159 in first cleaning head 152 blows air from the top of stencil 132 through the openings in stencil design 134 while, simultaneously, vacuum opening 164 draws a vacuum through the openings in stencil design 134, drawing excess solder paste downward and away from stencil 132. Any excess solder paste that is drawn away from stencil 132 is caught in filter 168 so that the solder paste does not get caught in air compressor 162.

Stencil 132 then moves to stencil dryer 170, which dries stencil 132 and stencil design 134 so that the solder paste applying process can be repeated on stencil design 134 as stencil 34 rolls along rollers 136*a*-136*d* to a subsequent workpiece 122.

Alternatively, a screen printing device 200 according to an alternative exemplary embodiment of the present invention may be used on a screen printing machine such that a workpiece 122 is indexed in a discrete stopping and starting motion through screen printing device 200. Exemplary screen printing machines on which screen printing device 200 may be used are the Momentum Series stencil printer manufactured by Speedline Technologies, located in Franklin Mass., the Infinity screen printer manufactured by DEK International, located in Weymouth, England and the E5 STS High-Precision Auto-Alignment Printer, manufactured by Ekra Automatisierungssysteme GmbH, located in Bonnigheim, Germany.

Figure 5:
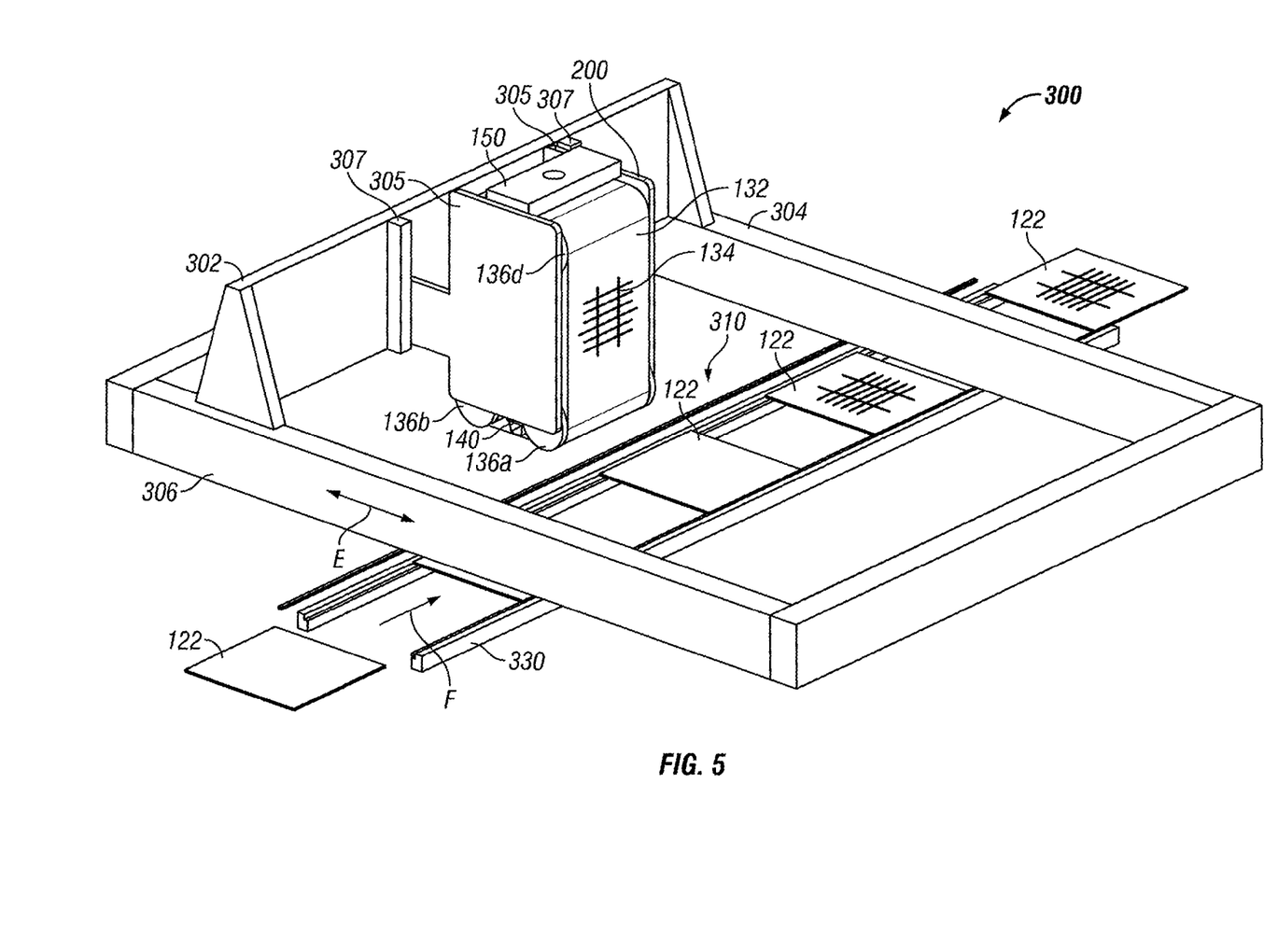
FIG. 5 is a perspective view of a screen printing device according to a second exemplary embodiment of the present invention in a pre-solder paste applying position.
Figure 6:
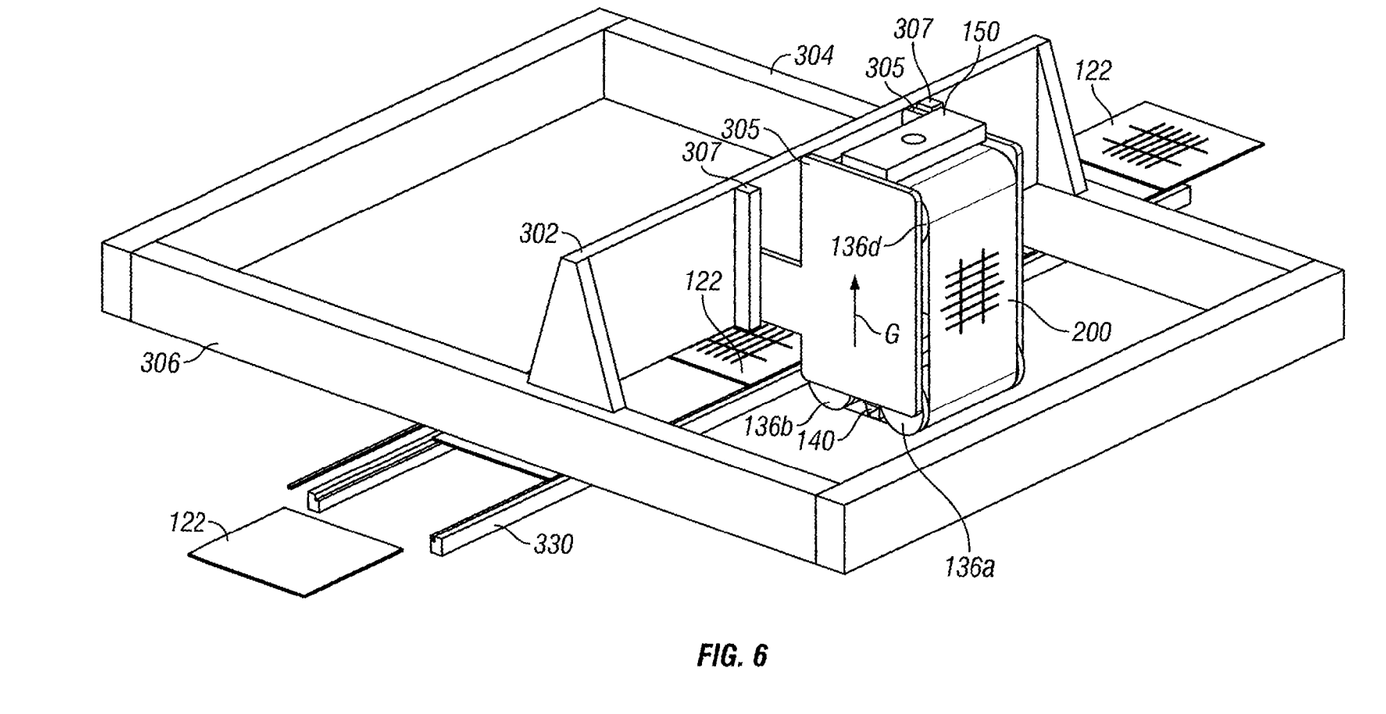
FIG. 6 is a perspective view of the screen printing device shown in FIG. 5, in a post-solder paste applying position.

As shown in the exemplary embodiment in FIGS. 5 and 6, screen printing device 200 is mounted on an overhead gantry 302 of a Momentum Series stencil printer 300 by a pair of brackets 305 mounted on either side of screen printing device 200. Brackets 305 support screen printing device 200 and also provide for vertical movement of screen printing device 200 relative to a workpiece 122. In an exemplary embodiment, in the position shown in FIG. 5, screen printing device 200 is mounted at a height relative to workpiece 122 such that, as overhead gantry 302 moves screen printing device 200 from the position shown in FIG. 5 to the position shown FIG. 6, stencil 132 engages workpiece 122.

Overhead gantry 302 slides along parallel rails 304, 306 in a back-and-forth direction indicated by arrow E. A workpiece 122 onto which solder paste is to be applied by screen printing device 200 is transferred to a solder paste applying area 310 on stencil printer 300, in an exemplary direction indicated by arrow F, which is generally orthogonal to arrow E.

Each workpiece 122 is transported by a conveyor 330 generally from left to right as shown in FIGS. 5 and 6. When workpiece 122 gets to solder paste applying area 310, conveyor 330 stops and overhead gantry 302 moves screen printing device 200 from the position shown in FIG. 5 toward the position shown in FIG. 6.

As screen printing device 200 passes over workpiece 122, rollers 136*a*-*d* (roller 136*c* not shown in FIG. 5) rotate stencil 132 as described above such that stencil pattern 134 engages workpiece 122. Solder paste applying station 140 applies solder paste through stencil pattern 134 onto workpiece 122.

After screen printing device 200 applies solder paste to workpiece 122, overhead gantry 302 moves screen printing device 200 to the position shown FIG. 6. Conveyor 330 moves soldered workpiece 122 toward the right as shown FIG. 6 and moves an unsoldered workpiece 122 into position for soldering. Screen printing device 200 is moved vertically the direction of arrow G so that, as overhead gantry 302 moves screen printing device 200 back to the position shown in FIG. 5, screen printing device 200 does not engage workpiece 122.

In an exemplary embodiment, brackets 305 may be fixedly connected to overhead gantry 302 and screen printing device 200 is moved vertically upward along brackets 305. In alternative exemplary embodiment, brackets 305 may be fixedly connected to screen printing device 200 and brackets 305 are moved vertically upward relative to overhead gantry 302. In either embodiment, precision linear bearings 307 may be used to effectuate the vertical motion. Exemplary precision linear bearings 307 may be manufactured by THK America, Inc., located in Schaumburg Ill. Each linear bearing 307 may be operated via a pneumatic cylinder or an electric motor. In the exemplary embodiment shown in FIG. 5, brackets 305 are fixedly connected to screen printing device 200 and brackets 305 are moved vertically upward relative to overhead gantry 302 by linear bearings 307.

As stencil 132 is rotated by rollers 136*a*-*d*, stencil pattern 134 is cleaned by cleaning station 150 mounted between rollers 136*c* and 136*d* as described above with reference to FIGS. 1 and 4.

Figure 7:
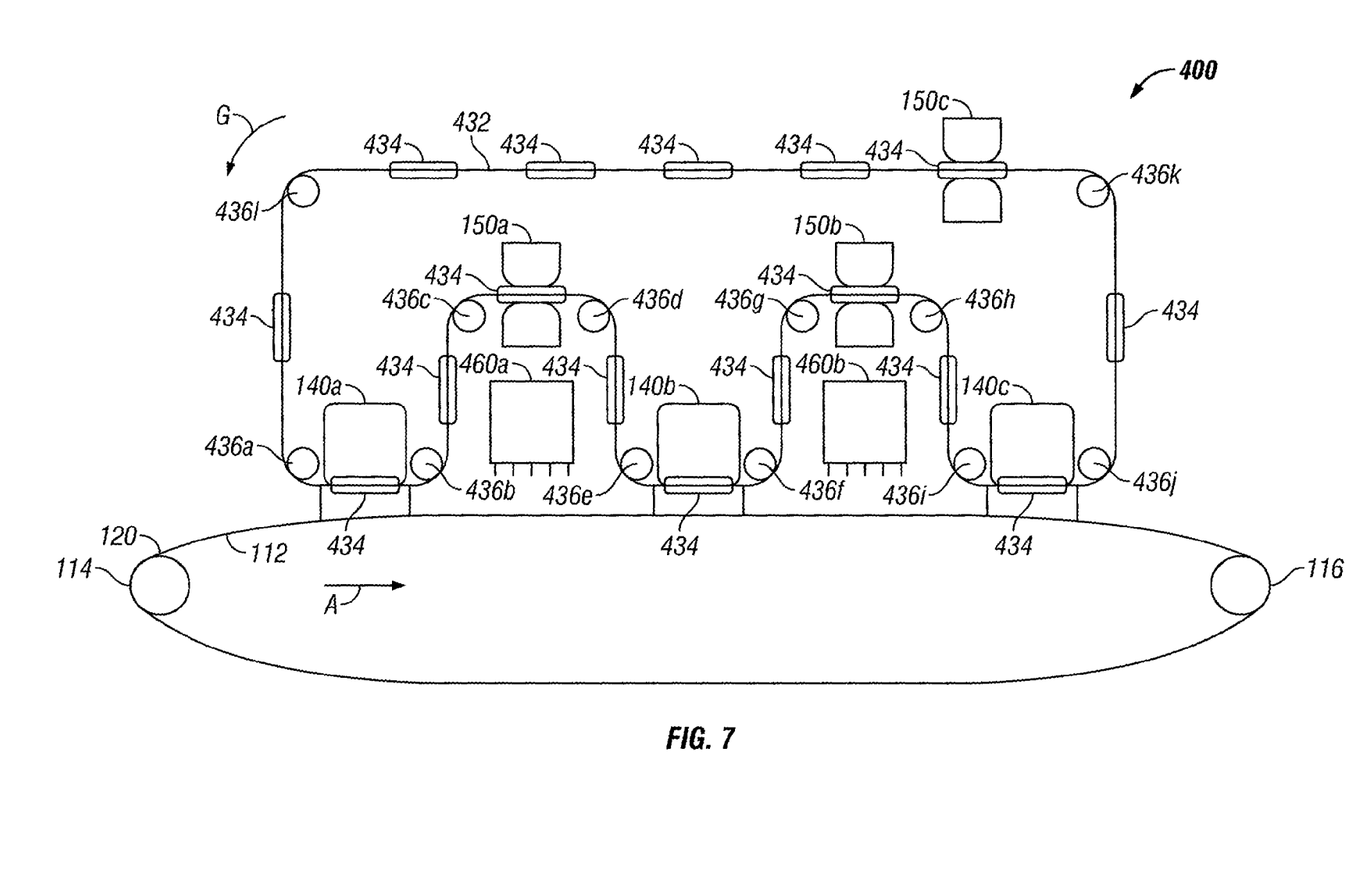
FIG. 7 is a schematic drawing of a screen printing device according to an alternative exemplary embodiment of the present invention.

In alternative exemplary embodiment, shown in FIG. 7, a diagrammatic representation of a screen printing device 400 according to the present invention is shown. Instead of a single solder paste applying station 140, as used in screen printing device 100 described above, screen printing device 400 uses a plurality of solder paste applying stations 140*a*-140*c* and a plurality of cleaning stations 150*a*-150*c*. In the exemplary embodiments shown in FIG. 7, three (3) solder paste applying stations 140*a*-140*c* and three (3) cleaning stations 150*a*-150*c* are shown. Those skilled in the art, however, will recognize that more or less than three solder paste applying stations 140*a*-140*c* and three cleaning stations 150*a*-150*c* may be used.

The plurality of solder paste applying stations 140*a*-140*c* allow a stencil 432 to simultaneously engage and apply solder paste to multiple workpieces 122, with each workpiece 122 located in a discrete location. Additionally, the multiple solder paste applying stations 140*a*-140*c* and cleaning stations 150*a*-150*c* may be useful when it is desired to apply several layers of solder paste onto workpiece 122 in order to build up the solder paste to a desired height above workpiece 122. For example, a benefit of having multiple solder paste applying stations 140*a*-140*c* is that one can perform "print-on-print" operations to increase the thickness of the solder paste, such as for solar applications, as discussed above. With an infinite loop stencil 432, this task is accomplished without re-registering workpiece 122 and with no effect on the throughput of workpieces 122 through screen printing device 400.

As shown in FIG. 7, solder paste applying stations 140*a*-140*c* and cleaning stations 150*a*-150*c* are alternated along the loop of stencil 432 such that stencil cleaning station 150*a* is operatively located to clean stencil 432 between solder paste applying stations 140a and 140b, stencil cleaning station 150b is operatively located to clean stencil 432 between solder paste applying stations 140b and 140c, and stencil cleaning station 150c is operatively located to clean stencil 432 between solder paste applying stations 140c and 140a, even though cleaning station 150c is located above solder paste applying station 140c.

In order to ensure that newly applied solder paste from solder paste applying station 140a is dry before applying solder paste at an adjacent solder paste applying station 140b, heater stations 460a and 460b are operatively located along conveyor 120 between solder paste applying stations 140a-140c. Heater stations 460a and 460b may each include an infrared heater that can quickly dry the solder paste on workpiece 122 before conveyor 120 transports workpiece 122 to the next solder paste applying station 140. Although not shown, and additional heater station may be located downstream of solder paste applying station 140c, to the right side of FIG. 7.

A plurality of rollers 436a-430l are used to change the direction of stencil 432 so that stencil 432 passes over each heater station 460. The horizontal and vertical spacing between adjacent rollers may be sized and stencil designs 434 be spaced along the length of stencil 432 so that a stencil design 434 is located at each solder paste applying station 140 simultaneously, with at least one stencil design 434 between adjacent solder paste applying stations 140a-140c. FIG. 7 illustrates sixteen (16) stencil designs 434 formed on stencil 432. Those skilled in the art, however, will recognize that more or less than that number of stencil designs 434 may be formed on stencil 432. The number of stencil designs 434 are spaced around the length of stencil 432 such that a stencil design 434 is located at a solder paste applying station 140a-140c at the same time a workpiece 122 is at the solder paste applying station 140a-140c. While FIG. 7 shows a workpiece 122 at each solder paste applying station 140a-140c simultaneously, those skilled in the art will recognize that workpieces 122 do not necessarily have to be at each solder paste applying station 140a-140c simultaneously.

While FIG. 7 illustrates stencil 432 changing direction around rollers 436a-436l in 90° increments, those skilled in the art will recognize that stencil 432 can change direction in other degree amounts as well. Rollers 436a-436l are arranged so that stencil 432 is adapted to engage a workpiece 122 in a plurality of discrete locations. Each discrete location corresponds to a solder paste applying station 140a-140c.

In operation, conveyor 120 is used to move a plurality of workpieces 122 in the direction of arrow A from an input end 114 to an output end 116 along the work passed 112. Stencil 432 moves in the direction of arrow G. The plurality of workpieces 122 are spaced apart from each other by a predetermined amount so that when each workpiece 122 is at a solder paste applying station 140, a stencil design 434 is aligned over top of the workpiece 122.

As stencil design 434 and workpiece 122 pass solder paste applying station 140a, solder is applied by solder paste applying station 140a through the openings in stencil design 434 and on the workpiece 122. After solder paste is applied to workpiece 122, conveyor 120 transports workpiece 122 to heater station 460a, where the solder paste is dry before the solder paste applying process is repeated at solder paste applying station 140b. Similarly, after solder paste is applied to workpiece 122 at solder paste applying station 140b, conveyor 120 transports workpiece 122 to second heater station 460b, which drives the solder paste it was applied to workpiece 122 at solder paste applying station 140b.

After solder paste is applied to workpiece 122 at solder paste applying station 140a, rollers 436b and 436c direct stencil 432 upward and away from conveyor 120 and over heater station 460a. While stencil 432 is away from conveyor 120, stencil 432 is transported past cleaning station 150a, which removes any excess solder paste from stencil design 434. After stencil design 434 has been cleaned, rollers 436d and 436e redirect stencil 432 downward and parallel to conveyor 120, were stencil passes through solder paste applying station 140b, and a second application of solder paste is applied to workpiece 122 through stencil design 434.

The stencil cleaning process is repeated at cleaning station 150b. Stencil design 434 then passes through solder paste applying station 140c, where a third application of solder paste is applied to workpiece 122 through stencil design 434. The stencil cleaning process is again repeated at cleaning station 150c. Stencil 432 continues to roll around rollers 436a-436l until stencil pattern 434 engages a new workpiece 122 at input end 114 of work path 112 and the process is repeated.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

What is claimed is:

1. A screen printing device comprising:
   a plurality of screen printer workstations, each workstation having a work path, the work path having an input end, and output end;
   a conveyor for transporting a workpiece between the input end and the output end; and
   an endless loop stencil passing through each of the plurality of workstations, the stencil having a plurality of individual stencil designs formed therein such that, as each stencil design is positioned between each of the input end and the output end of selected workstations, printing is performed on the workpiece via the stencil design.

2. The screen printing device according to claim 1, wherein further comprises a stencil cleaning station disposed between two of the plurality of workstations to clean the stencil.

3. The screen printing device according to claim 2, wherein the stencil cleaning station comprises a first cleaning head located on a first side of the stencil and a second cleaning head located on an opposing side of the stencil.

4. The screen printing device according to claim 3, wherein the first cleaning head comprises a discharge opening in fluid communication with a gas discharge supply.

5. The screen printing device according to claim 4, wherein the first cleaning head further comprises a stencil scrubber located on an upstream side of the discharge opening.

6. The screen printing device according to claim 5, wherein the first cleaning head further comprises a stencil dryer located on a downstream side of the discharge opening.

7. The screen printing device according to claim 4, wherein the second cleaning head comprises a vacuum opening in fluid communication with a vacuum.

8. The screen printing device according to claim 7, wherein the discharge opening is aligned with the vacuum opening.

9. The screen printing device according to claim 7, further comprising a vacuum system having a vacuum line in fluid communication with the vacuum opening and a discharge in fluid communication with the discharge opening.

10. The screen printing device according to claim 1, wherein the conveyor for transporting the workpiece travels at a linear velocity and wherein the stencil travels at the same linear velocity.

11. The screen printing device according to claim 1, further comprising a means for rolling the stencil in a direction from the input end toward the output end.

12. The screen printing device according to claim 11, wherein the means for rotating the stencil is operatively coupled to the conveyor for transporting the workpiece.

13. The screen printing device according to claim 1, wherein the conveyor for transporting the workpiece comprises an endless belt loop comprising a plurality of recessed cavities, wherein each recessed cavity is adapted to receive a workpiece.

14. The screen printing device according to claim 1, wherein the conveyor for transporting the workpiece comprises an endless belt loop comprising a plurality of perforations extending therethrough, and wherein the workstation further comprises a vacuum operatively located along the endless belt loop and adapted to draw a vacuum through the plurality of perforations extending therethrough.

15. The screen printing device according to claim 1, further comprising a solder paste dispenser associated with each of the screen printer workstations.

16. The screen printing device according to claim 1, further comprising a secondary work station located between adjacent ones of the plurality of screen printer workstations, the endless loop stencil configured to bypass the secondary station as the stencil design moves from one of the plurality of screen printer workstations to an adjacent screen printer workstation.

* * * * *